United States Patent
Cheng et al.

(10) Patent No.: US 6,506,633 B1
(45) Date of Patent: Jan. 14, 2003

(54) METHOD OF FABRICATING A MULTI-CHIP MODULE PACKAGE

(75) Inventors: Jao-Chin Cheng, Hsinchu (TW); Chih-Peng Fan, Taipei Hsien (TW); David C. H. Cheng, Taoyuan Hsien (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 10/078,212

(22) Filed: Feb. 15, 2002

(51) Int. Cl.[7] .................. H01L 21/44; H01L 21/48; H01L 21/50
(52) U.S. Cl. ............ 438/126; 438/108; 438/109; 438/125; 438/127
(58) Field of Search ................. 438/108, 109, 438/125–127

(56) References Cited

U.S. PATENT DOCUMENTS 5,831,833 A * 11/1998 Shirakawa et al. ......... 257/724
6,300,163 B1 * 10/2001 Akram ....................... 257/777

* cited by examiner

Primary Examiner—David L. Talbott
Assistant Examiner—David A. Zarneke
(74) Attorney, Agent, or Firm—J.C. Patents (57) ABSTRACT

A method of fabricating a multi-chip module (MCM) package that can fabricate the substrate and the package simultaneously. The bonding pads of a chip are exposed by forming a patterned dielectric layer, and the bonding pads of the chip are electrically connected to the substrate by utilizing to an electroplating to form a metal layer. The present invention provides a fabircating method that can prevent air bubble produced in the patterned dielectric layer and improve the connection ability between the chip and the substrate.

26 Claims, 11 Drawing Sheets

METHOD OF FABRICATING A MULTI-CHIP MODULE PACKAGE

BACKGROUND OF THE INVENTION

1. Field of Invention

The present invention relates generally to a method of fabricating a multi-chip module (MCM) package. More particularly, the present invention relates to a fabricating method of MCM package that can fabricate the substrate and the MCM package simultaneously.

2. Description of the Related Art

The demands of advanced electronic technology requires electronic products to be made lighter, thinner, faster and smarter while simultaneously making them more friendly, powerful, reliable, robust and less expensive. Therefore, the trend for electronic packages is to develop highly-integrated packaging structures. The multi-chip module (MCM) package can integrate several high performance chips together. Therefore, the packaging size is decreased and the reliability of the memory device is improved.

For a general multi-chip package, a plurality of bare dies or a portion of chips is packaged by using a surface mount technology (SMT) to integrated and connected to each other on a same substrate. The multi-chip package utilizes the bare dies to increase the package density, to reduce the required space and decrease the signal delay. Therefore, the multi-chip technique can achieve the high speed performance, and because several chips with various functions can be integrated together, thus, the multi-chip device has this advantage of consisting various functions.

The conventional method fabricating the MCM package is to adhere a plurality of chips onto the substrate first, then performing the packaging process. The method of adhering the chip to the substrate can be characterized into two types:
1. forming bumps on the chips to electrically connect the connecting pads of the substrate by utilizing the flip-chip packaging technique.
2. Using a wire bonding method to electrically connect the chip to the substrate (direct chip attach technique, DCA).

However, no matter what type of technique is used to connect the chip to the substrate, the patterned-traces and the patterns of the connecting pads on the substrate are defined for connecting to the chip. Several problems are induced by the conventional connection.

In general, a flux is applied to the connecting pads in a flip-chip type of connection. The chip is aligned to the connecting pads of the substrate first, and then a reflow process is carried out to bond the chip to the substrate. However, the reliability of the connection is undesirable and the input/output terminals of the chip are not always aligned to the connecting pads of the substrate. Further, if the connection has some problem, the rework is very difficult and complex.

A underfill process is required to fill a paste into between the chip and the substrate, the technique of this underfilling process is very complex and difficult. Air bubbles are easily produced during the underfilling, causing the yield of the product decreased.

For wire bonding process, the problems of the thin gold wires, the bonding strength of the wires, the connecting reliability can cause the electrical signal to delay. Further, a molding process is performed after the wire bonding process, air bubble may also produce during the molding process.

From the above-described conventional method of connecting the chip to the substrate, the connecting reliability is poor and the air bubble produced during the underfilling and molding processes to decrease the yield of the package.

SUMMARY OF THE INVENTION

It is an object of the present invention is to provide a method of fabricating a MCM package to improve the yield of the device. It is another object of the present invention to provide a method of fabricating a MCM package that can ensure the good connecting between the chip and the substrate. It is another object of the present invention to provide a method of fabricating a MCM package that can prevent the air bubble produced during the underfilling and molding processes.

To achieve the foregoing and other objects and in accordance with the purpose of the present invention, the present invention provides a substrate, and the substrate has an insulating core and a conductive layer. The conductive layer covers a bottom surface of the insulating core. A first opening is formed in the substrate to penetrate through the insulating core and the conductive layer. An adhesive tape is adhered on the substrate to cover a surface of the conductive layer, wherein the first opening exposes a portion of a top surface of the adhesive tape. A first chip is located on the exposed top surface of the adhesive tape, and the first chip has an active surface and a back surface. A plurality of bonding pads are formed on the active surface of the first chip, the back surface of the first chip is adhered onto the adhesive tape such that the first chip is located firmly on the adhesive tape. A patterned dielectric layer is formed to fill into the first opening such that a portion of the exposed top surface of the adhesive tape, the active surface of the first chip, the bonding pads of the chip and the insulating core are covered with the patterned dielectric layer. A plurality of second openings and third openings are formed in the patterned dielectric layer. The second openings expose the bonding pads of the first chip and the third openings penetrate through the patterned dielectric layer, the insulating core and the conductive layer. A metal layer is electroplated on sidewalls of the second openings and the third openings, and to cover the patterned dielectric layer. After the electroplating process, the adhesive tape is removed to expose the conductive layer, the back surface of the first chip and a portion of the patterned dielectric layer. A patterned metal and a patterned conductive layer are formed. A patterned solder mask layer is formed to cover surfaces of the patterned metal layer and the patterned conductive layer. A plurality of fourth openings and fifth openings are formed on the patterned solder mask layer to expose respectively a portion of the patterned metal layer and a portion of the patterned conductive layer. A solder ball process is carried out to form a plurality of solder balls on the fifth openings. A reflow process is carried out to electrically connect the solder balls to the patterned conductive layer. A second chip is electrically connected to the patterned metal layer via the fourth openings.

The present invention provides a method of fabricating a multi-chips module that can carry out the fabrications of the chip and the substrate simultaneously so that the flow of the fabricating process is simplified.

The present invention provides a method of forming the patterned dielectric layer in order to expose the bonding pads of the chip and then utilizing the electroplating method to form the metal layer so that the bonding pads of the chip is electrically connected to the substrate. Thus, the connection between the chip and the substrate is more reliable.

The present invention provides a method that can prevent the problem of the air bubble in the molding process or underfilling process.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
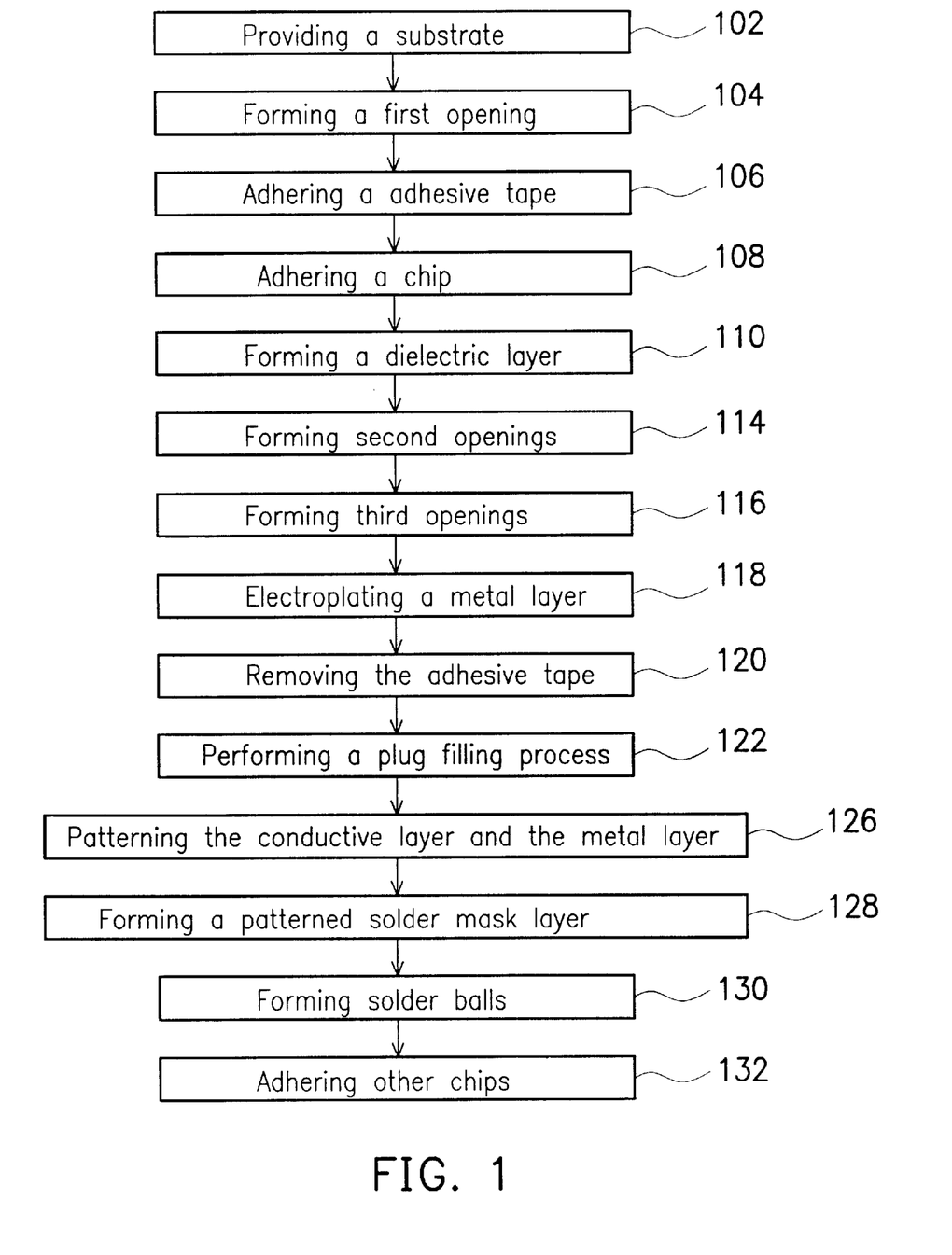
FIG. 1 is a-flow block diagram of fabricating a multi-chip module (MCM) package in accordance with a first preferred embodiment of the present invention.

FIG. 1 illustrates a flow block diagram of fabricating a multi-chip module (MCM) package in accordance with a first preferred embodiment of the present invention. FIGS. 2 to 15 show schematic cross-sectional views of fabricating a MCM package in accordance with a first preferred embodiment of the present invention.

Figure 2:
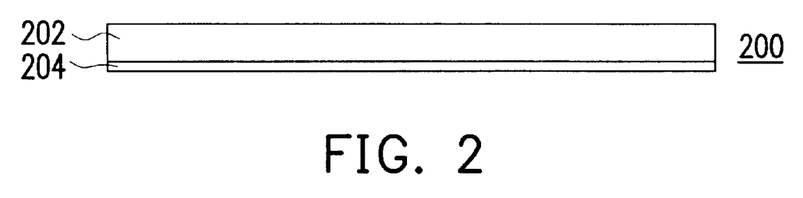
FIGS. 2–15 are schematic cross-sectional views of fabricating a MCM package in accordance with first preferred embodiment of the present invention.
Figure 3:
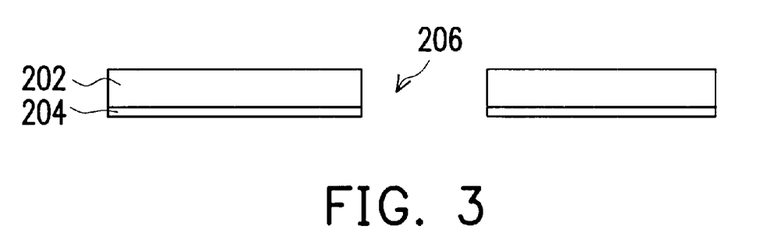

Referring to FIG. 2, a substrate 200 is provided as recited in 102 of FIG. 1. An insulating core 202 and a conductive layer 204 are formed on the substrate 200, and the insulating core 202 covers a top surface of the conductive layer 204. The dielectric layer can include such as a copper layer, for example. Referring to FIG. 3, a first opening 206, which is formed in the substrate 200 (as disclosed in step 104 of FIG. 1) penetrates though the insulating core 202 and the conductive layer 204. The first opening 206 in the substrate 200 can be fabricated by a punching method.

Figure 4:
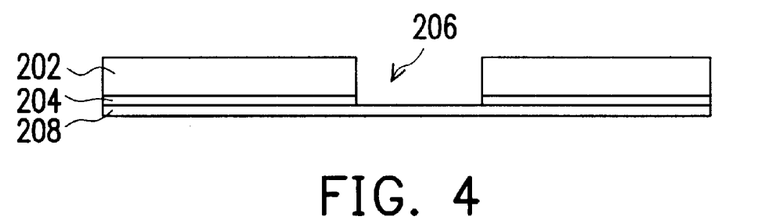
Figure 5:
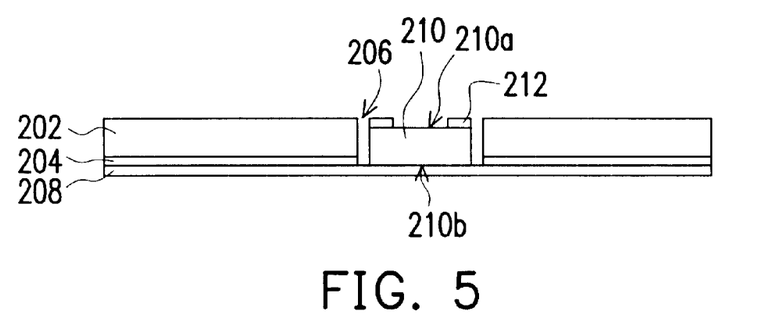

In FIG. 4, an adhesive tape 208 covers a bottom surface of the conductive layer 204. A portion of the adhesive tape 208 is exposed by the first opening 206. Referring to FIG. 5, a chip 210 is adhered onto a surface of the exposed adhesive tape 208 (as recited in step 108 of FIG. 1). The chip 210 has an active surface 210a and a back surface 210b and a plurality of bonding pads 212 are formed on the active surface 210a of the chip 210. The chip 210 is attached fixedly to the exposed adhesive tape 208.

Figure 6:
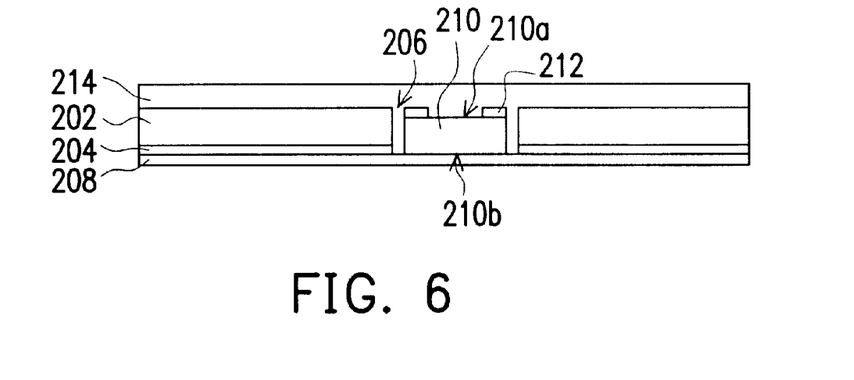
Figure 7:
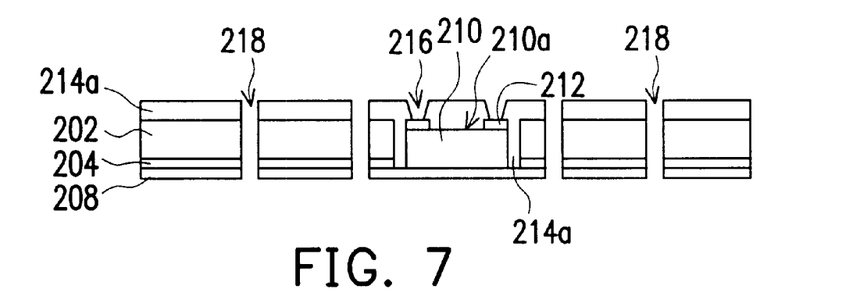

Referring to FIG. 6, a dielectric layer 214 is formed (as recited in step 110 of FIG. 1) to fill the first opening 206. The dielectric layer 214 covers insulating core 202, a portion of the adhesive tape 208, the active surface 210a of the chip 210 and the bonding pads 212. Before forming a second opening (as recited in step 115 of FIG. 1), a planarizing process is performed (not shown) to planarize the surface of the dielectric layer 214. The planarizing process includes a chemical mechanical polishing (CMP) method. In FIG. 7, a plurality of second opening 216 (as disclosed in step 114 of FIG. 1) is formed on the dielectric layer 214 to expose the bonding pads 212. A plurality of third opening 218 is formed (as recited in step 116 of FIG. 1) to penetrate through the dielectric layer 214, the insulating core 202 and the conductive layer 204 such that a patterned dielectric layer 214a is obtained.

The fabrication of the second opening 216 includes such as a laser drilling method. However, the fabrication of the second opening 216 is not limited to one particular method as long as the bonding pad 212 can be exposed. As a matter of fact, a photographic etching method can be utilized to fabricate the second opening. Forming a patterned photoresist layer (not shown) to cover the dielectric layer so that the patterned photoresist layer is used as a mask to etch the dielectric layer in order to form the second opening. The bonding pads are thus exposed. A machine drilling method can be used to form the third opening 218.

Figure 8:
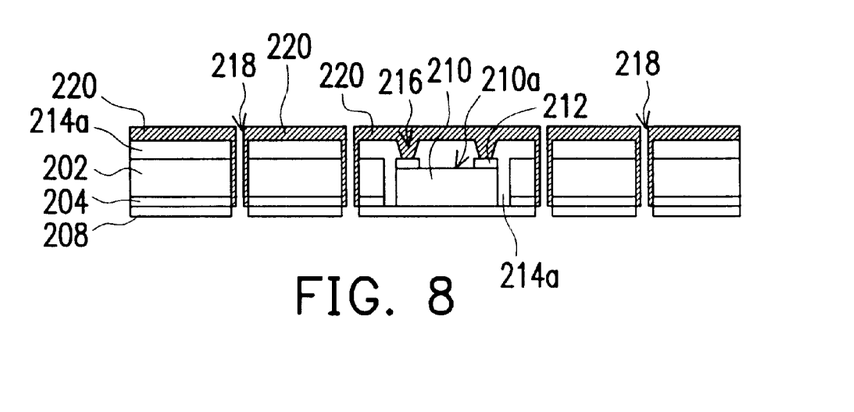
Figure 9:
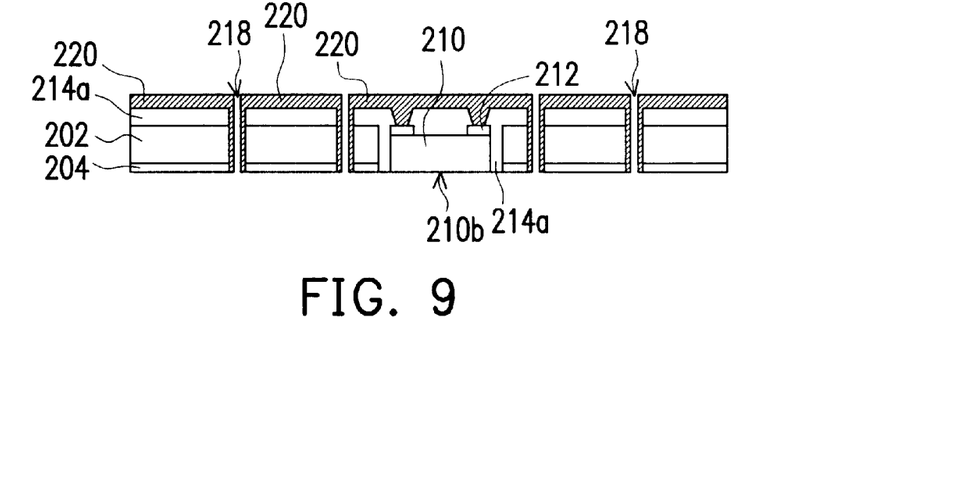

Referring to FIG. 8, a metal layer 220 is formed by electroplating to cover the patterned dielectric layer 214a and conformal to the sidewalls of the second openings 216 and the third openings 218 (as disclosed in step 118 of FIG. 1). This electroplating step can use such as an electricless plating method to form the metal layer 220 on the patterned dielectric layer and the sidewalls of the second and third openings 216 & 218. The metal layer 220 is then used as a seed layer for electroplating. In FIG. 9, after the electroplating step, the adhesive tape 208 is removed (as recited in step 120 of FIG. 1) to expose the conductive layer 204, the back surface 210b of the chip 210 and the portion of the dielectric layer 214a.

Figure 10:
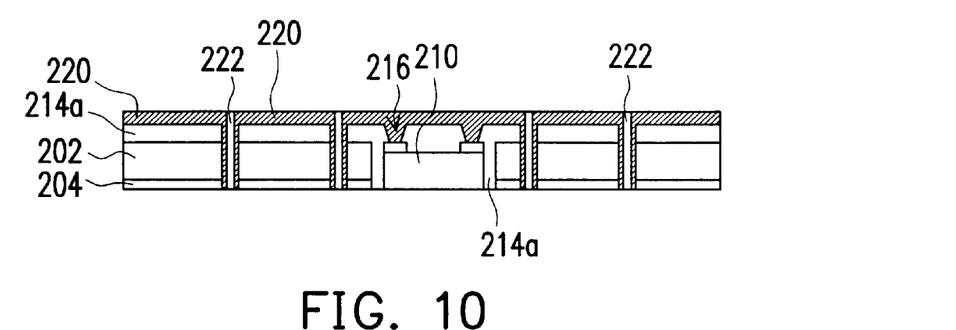
Figure 11:
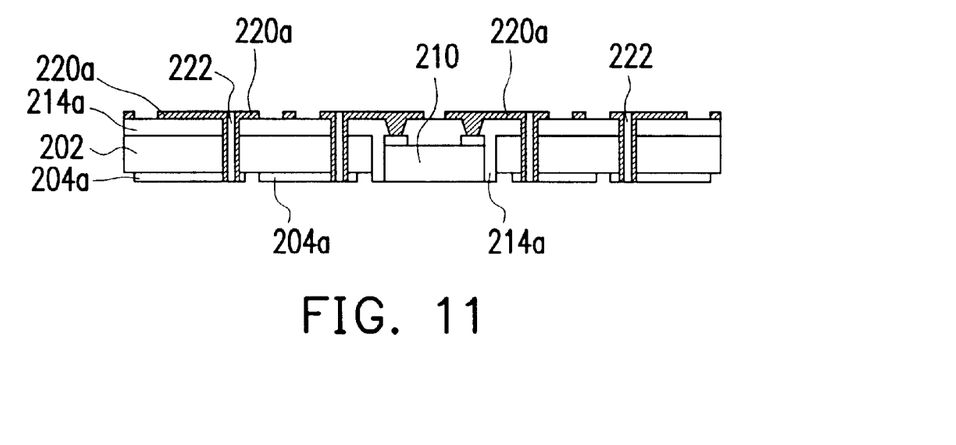

Referring to FIG. 10, a plug filling process is carried out before forming a patterned metal layer and a patterned conductive layer. A plug material 222 is filled into the third openings 218. In FIG. 11, a planarizing process such as a CMP process is performed to planarize the metal layer 220.

Figure 12:
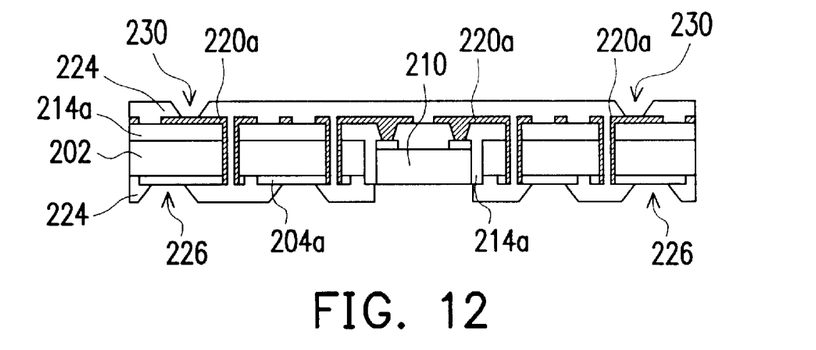
Figure 13:
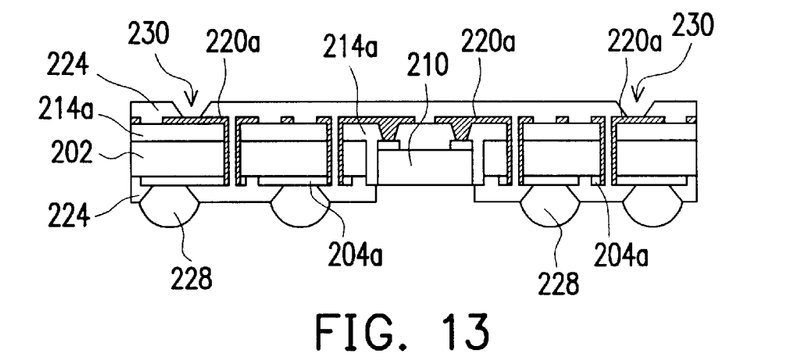

From FIG. 12, the patterned metal layer 220a and the patterned conductive layer 204a are formed. A patterned solder mask layer 224 is formed (as recited in step 128 of FIG. 1) to cover surfaces of the patterned metal layer 220a and the patterned conductive layer 204a. A plurality of fourth openings 230 and fifth openings 226 are formed on the patterned solder mask layer 224 to expose the a portion of the patterned metal layer 220a and a portion of the patterned conductive layer 204a, as shown in FIG. 13. A formation of solder ball is carried out to form a plurality of solder balls in the fifth openings 226 (as disclosed in step 130 of FIG. 1). A heating process (a reflow process) is performed to electrically connect the solder balls 228 to the patterned conductive layer 204a.

Figure 14:
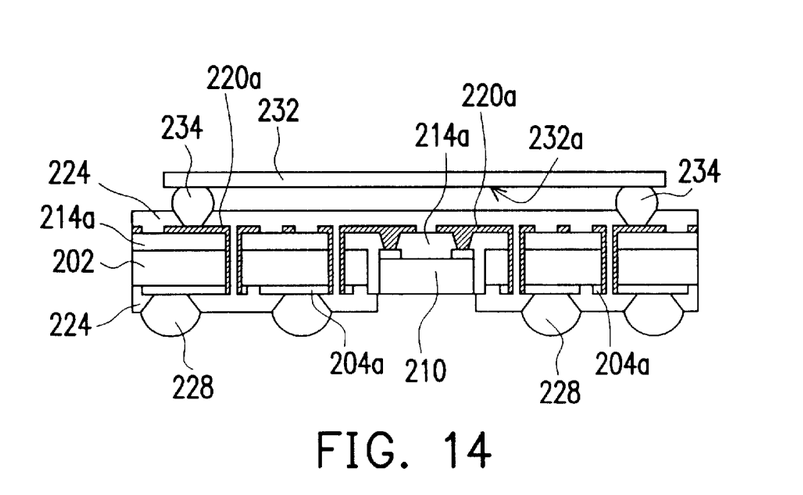
Figure 15:
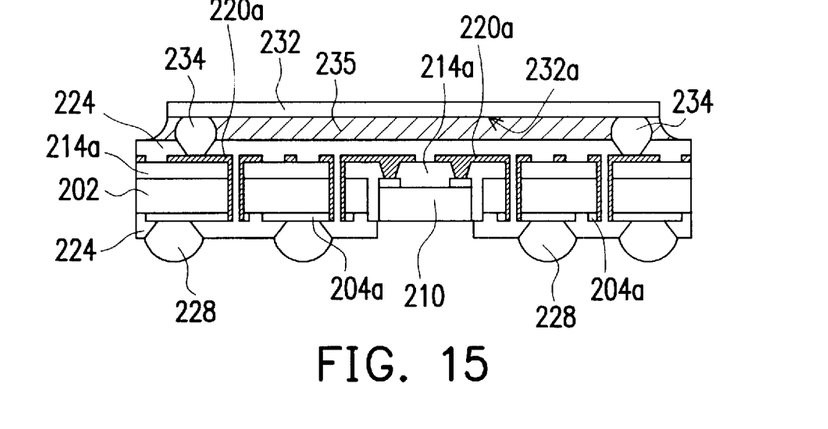

Referring to FIG. 14, a die adhering process is carried out to electrically connect at least a chip 232 to the patterned metal layer 220a via the fourth openings 230. The chip 232 has an active surface 232a, and a plurality of conductive bumps 234 is formed on the active surface 232a of the chip 232. During the reflow process, the conductive bumps 234 are electrically connected to the exposed patterned metal layer 220a via the fourth openings 230. An underfill material 235 is filled in a gap between the active surface 232a of the chip 232 and the patterned solder mask layer 224 as shown in FIG. 15.

Figure 16:
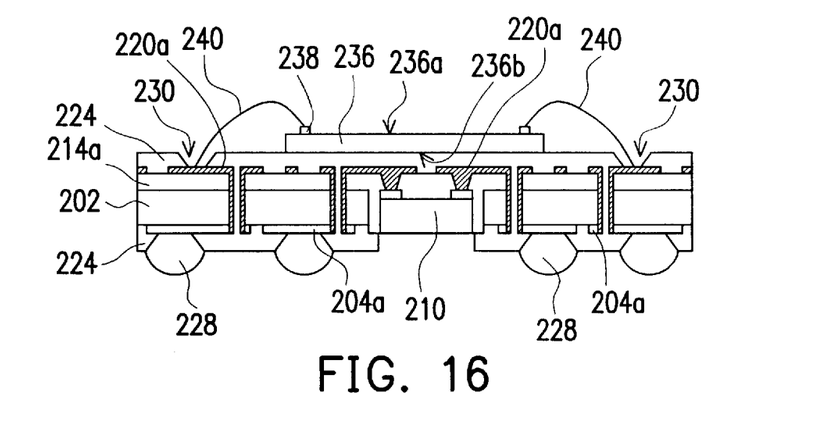
FIGS 16–17 are schematic cross-sectional views of fabricating a MCM package in accordance with a first alternative embodiment of the present invention.
Figure 17:
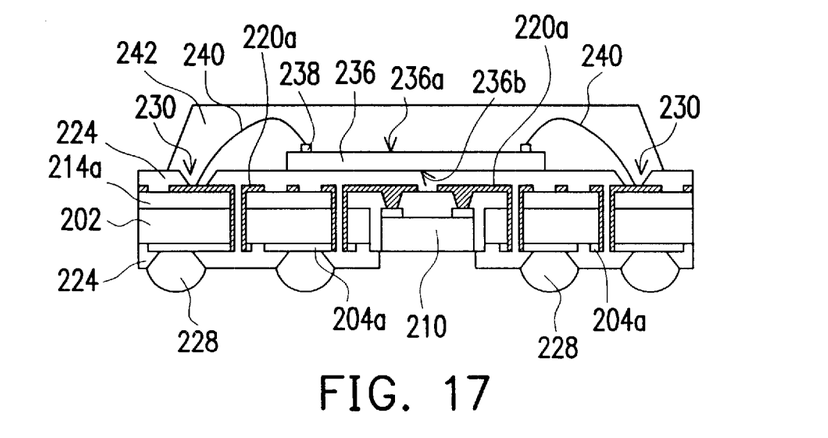

The foregoing die adhering process utilizes a flip chip method to connect the chip 232 to the substrate (except a chip 210). However, other methods can be implemented, such as a wire bonding method, to connect the chip to the substrate. FIGS. 16–17 illustrate schematic cross-sectional views of using a wire bonding method to attach a chip 236 to the substrate in accordance with another preferred embodiment of the invention.

Referring to FIG. 16, at least a chip 236 is electrically connected to the patterned metal layer 220a through the fourth openings 230. The chip 236 has an active surface 236a and a back surface 236b. A plurality of bonding pads 238 is formed on the active surface 236a of the chip 236. The back surface 236b of the chip 236 is adhered onto the solder mask layer 224 such that the chip 236 is located firmly on the solder mask layer 224. A plurality of conductive wires is electrically connected form the bonding pads 238 of the chip 236 to the exposed patterned metal layer 220a via the fourth openings 230. From FIG. 17, a molding process is carried out to encapsulate the chip 236, the conductive wires 240, the fourth openings 230, the exposed portion of the patterned metal layer 220a and a portion of the patterned solder mask layer 224 with a molding material 242.

From the above-mentioned embodiment, the purpose of using the adhesive tape is to locate the chip 210 firmly. However, other methods can be implemented in the present invention. The first opening 206 can be formed without penetrating the conductive layer 204, thus the first opening 206 is formed into a cavity-shaped hole. The chip 210 can be attached on the surface of the conductive layer inside the cavity-shaped first opening 204. Therefore, the chip 210 is located firmly on the substrate.

Figure 18:
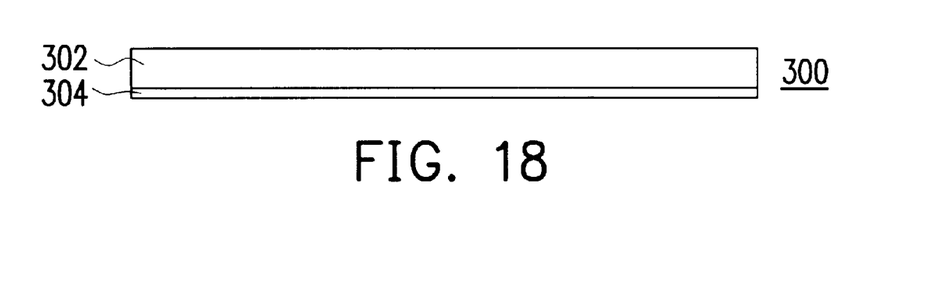
FIGS. 18–19 are schematic cross-sectional views of fabricating a MCM package in accordance with a second preferred embodiment of the present invention.
Figure 19:
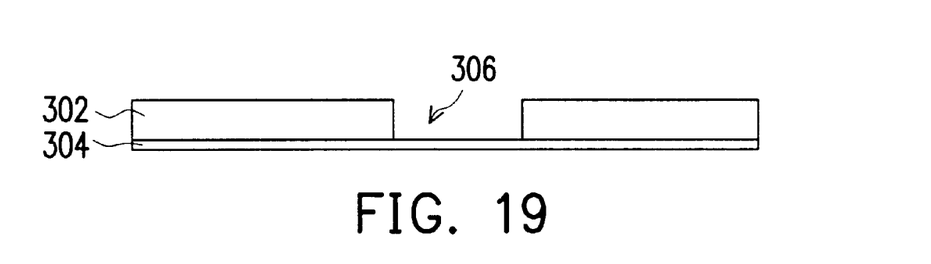

Referring to FIG. 18, a substrate 300 has an insulating core 302 and a conductive layer 304. The conductive layer 304 that is located below the insulating core 302 covers a bottom surface of the insulating core 302. The conductive layer 304 includes such as a cooper layer. From FIG. 19, a first opening 306 is formed to penetrate through the insulating core 302 and expose a portion of the conductive layer 304. A machine drilling method can be utilized to form the first opening 306.

Figure 20:
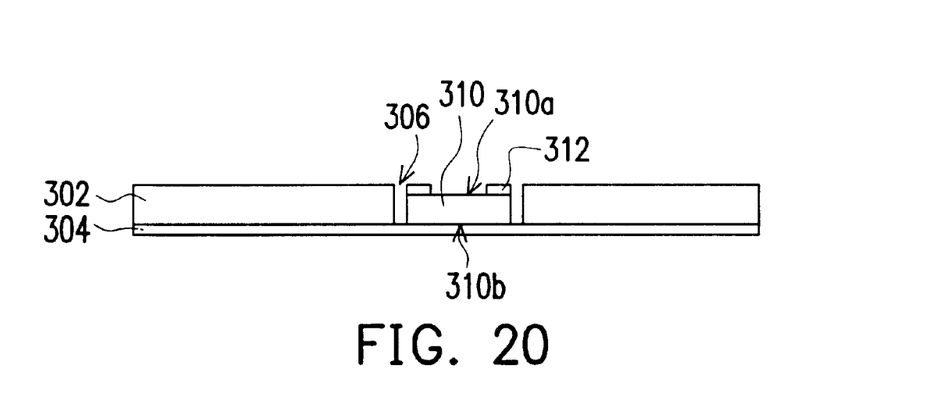
FIGS. 20–31 are schematic cross-sectional views of fabricating a MCM package in accordance with a second alternative embodiment of the present invention.

A chip 310 is located on a top surface of the exposed conductive layer 304, as shown in FIG. 20. The chip 310 has an active surface 310a and a back surface 310b, and a plurality of bonding pads 312 are formed on the active surface 310a of the chip 310. The back surface 310b of the chip 310 is attached firmly to the conductive layer 304.

Figure 21:
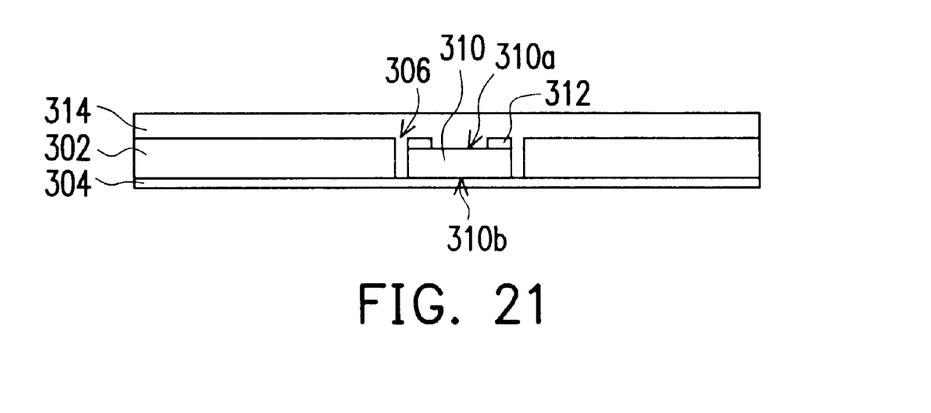
Figure 22:
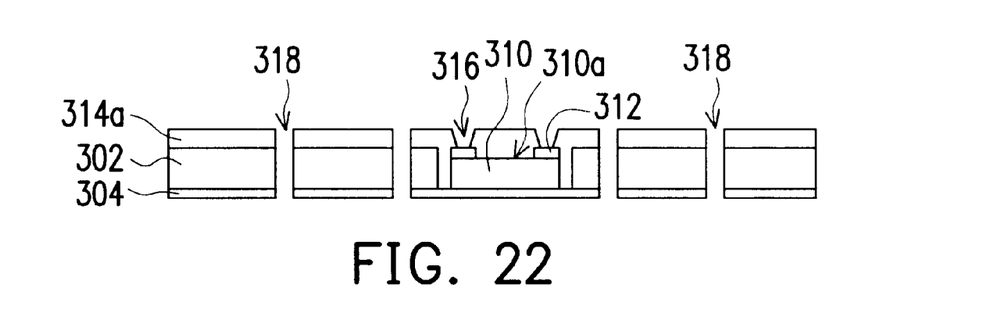

As shown in FIG. 21, a dielectric layer 314 is formed to fill the first opening 306 and cover the insulating core 302, a portion of the conductive layer 304, the active surface 310a of the chip 310 and the bonding pads 312. A planarizing process is performed to planarize the surface of the dielectric layer, for example a CMP process. In FIG. 22, a plurality of second openings 316 is formed in the conductive layer 314 to expose the bonding pads 312. A plurality of third openings 318 penetrates through the dielectric layer 314, the insulating core 302 and the conductive layer 304 such that a patterned dielectric layer 314a is obtained.

The second openings 316 can be formed by a laser drilling method, however, the formation of the second openings 316 is not limited to this method only. Any method that can expose the bonding pads 312 can be used such as a photographic etching method. A patterned photoresist layer (not shown) is formed to cover the dielectric layer 314. The patterned photoresist layer is used as a mask to etching the dielectric layer 314 so that the second openings 316 can be formed. The bonding pads 312 are thus exposed. The third openings 318 can be formed by a machine drilling method.

Figure 23:
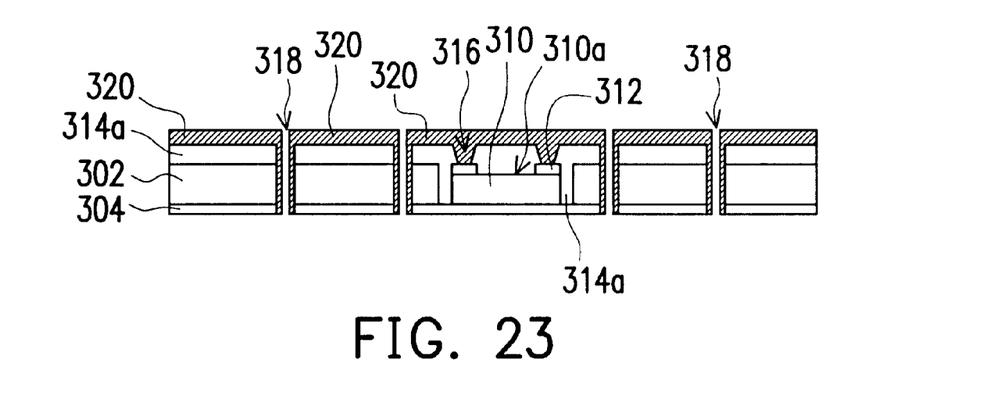
Figure 24:
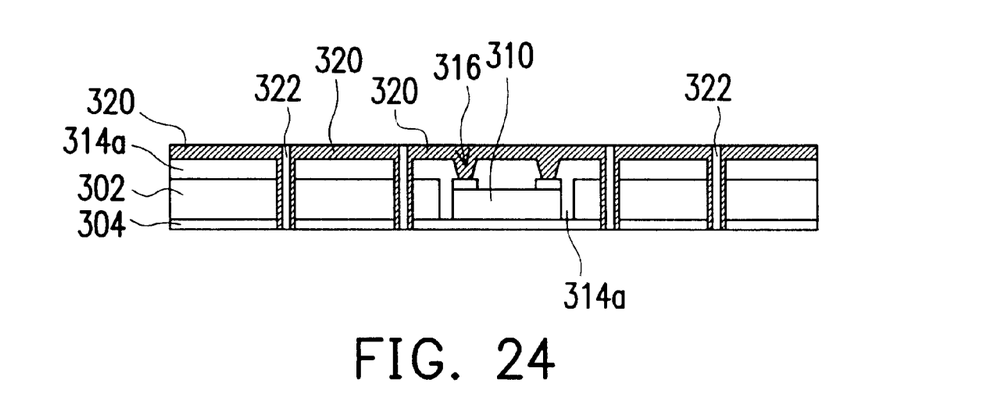

In FIG. 23, a metal layer 320 is electroplated on sidewalls of the second openings 316 and the third openings 318, and covers the patterned dielectric layer 314a. This electroplating step can use such as an electricless plating method to form the metal layer 320 on the patterned dielectric layer 314a and the sidewalls of the second and third openings 316 & 318. The metal layer 320 is then used as a seed layer for electroplating. As shown in FIG. 32, a plug filling process is carried out to fill the third openings 318 with a plug material 322. A planarizing process such as a CMP process is performed to planarize the metal layer 320 (not shown).

Figure 25:
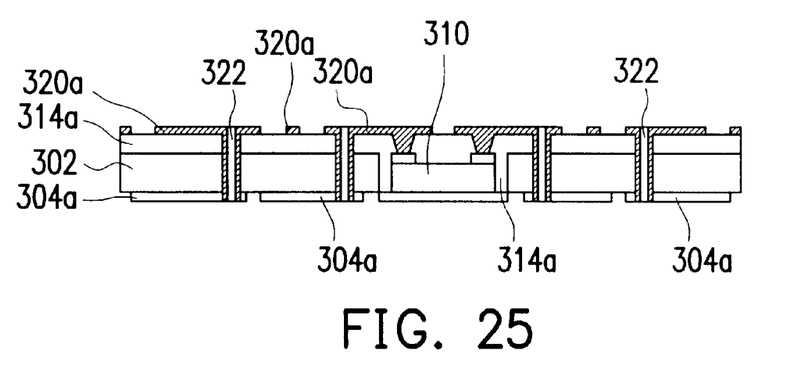
Figure 26:
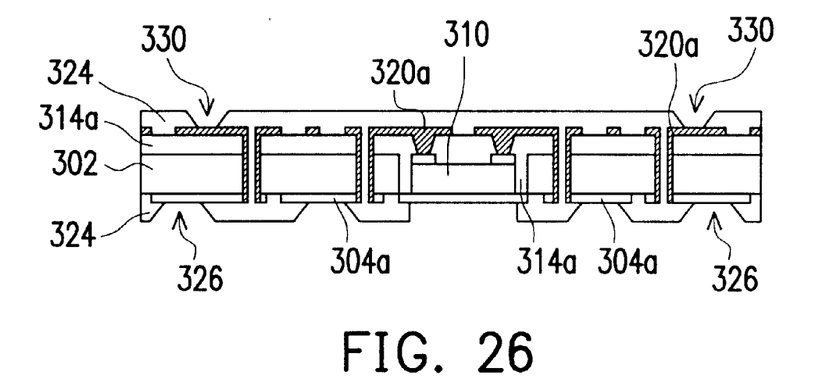
Figure 27:
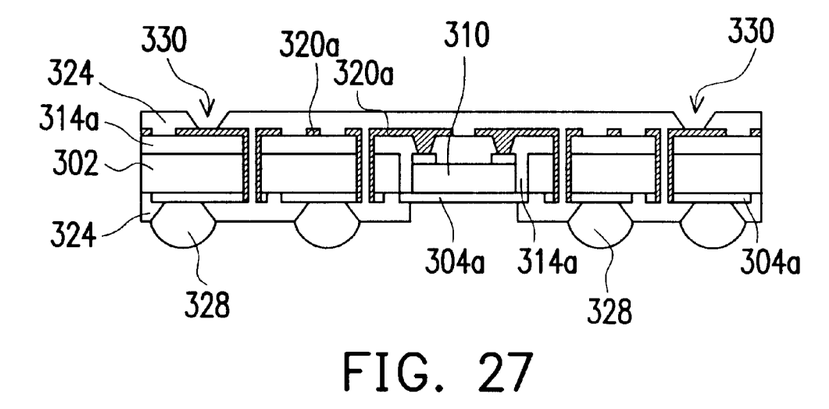

A patterned metal layer 320a and a patterned conductive layer 304a are formed as shown in FIG. 25. As shown in FIG. 26, a patterned solder mask layer 324 is formed in order to cover surfaces of the patterned metal layer 320a and the patterned conductive layer 304a. A plurality of fourth openings 330 and fifth openings 326 are formed on the patterned solder mask layer 324 to expose the a portion of the patterned metal layer 320a and a portion of the patterned conductive layer 304a, as shown in FIG. 26. A formation of solder ball is carried out to form a plurality of solder balls in the fifth openings326. A heating process (a reflow process) is performed to electrically connect the solder balls 328 to the patterned conductive layer 304a.

Figure 28:
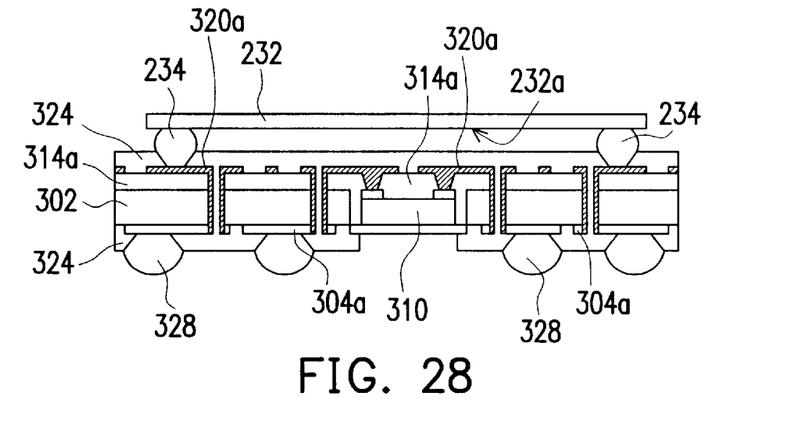
Figure 29:
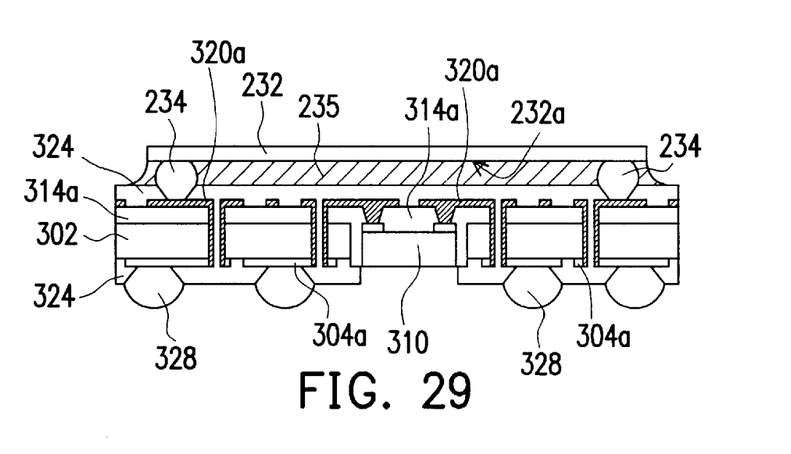

Referring to FIG. 28, a die adhering process is carried out to electrically connect at least a chip 232 to the patterned metal layer 320a via the fourth openings 330. The chip 232 has an active surface 232a, and a plurality of conductive bumps 234 is formed on the active surface 232a of the chip 232. During the reflow process, the conductive bumps 234 are electrically connected to the exposed patterned metal layer 320a via the fourth openings 230. An underfill material 235 is filled in a gap between the active surface 232a of the chip 232 and the patterned solder mask layer 324.

Figure 30:
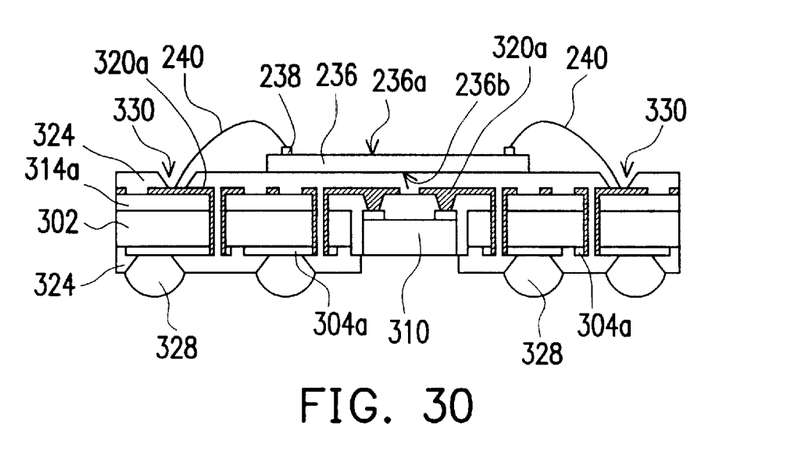
Figure 31:
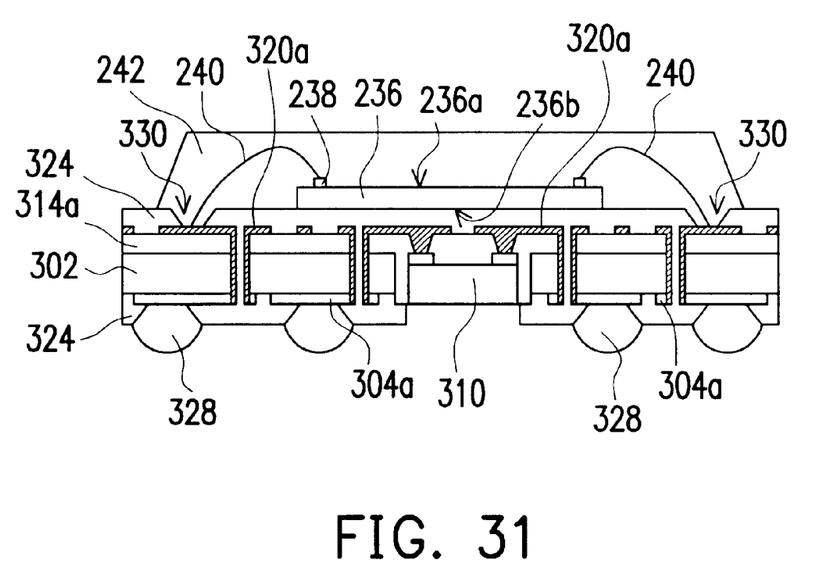

The above-mentioned die adhering process can be implemented with other methods, such as a wire bonding method, to electrically connect the chip to the substrate. FIGS. 30–31 illustrate schematic cross-sectional views of using a wire bonding method to attach a chip 236 to the substrate in accordance with another preferred embodiment of the invention.

Referring to FIG. 30, at least a chip 236 is electrically connected to the patterned metal layer 320a through the fourth openings 330. The chip 236 has an active surface 236a and a back surface 236b. A plurality of bonding pads 238 is formed on the active surface 236a of the chip 236. The back surface 236b of the chip 236 is adhered onto the solder mask layer 324 such that the chip 236 is located firmly on the solder mask layer 324. A plurality of conductive wires 240 is electrically connected the bonding pads 238 of the chip 236 to the exposed patterned metal layer 320a via the fourth openings 330. FIG. 31, a molding process is carried out to encapsulate the chip 236, the conductive wires 240, the fourth openings 330, the exposed portion of the patterned metal layer 320a and a portion of the patterned solder mask layer 324 with a molding material 242.

The conventional method of connecting the chip to the substrate is carried out after the substrate is fabricated. However, the present invention provides a method of connecting the chip to the substrate and fabricating the substrate simultaneously. According to the characteristics of the invention is to form the patterned dielectric layer first such that the bonding pads of the chip are exposed. The bonding pads of the chip are then electrically connected to the substrate by utilizing the electroplated metal layer. Compare the technique used in the invention to the conventional flip-chip technique by using the solder bumps or the wire bonding method to connect the chip to the substrate, the present invention is more reliable and can ensure the good connection between the chip and the substrate.

The present invention also provide a technique of forming the metal layer on the patterned dielectric layer by the electroplating method after forming the patterned dielectric layer. So that the problem of forming the air bubble in the patterned dielectric layer can be prevented. Thus, the problem of air bubble produced during the underfilling process or the molding process can be prevented.

The present invention locates the chip onto the substrate, and then utilizes the patterned dielectric layer and the electroplating method to electrically connect the chip to the substrate. The present invention further utilizes the method of forming the patterned metal layer and the conductive layer to form the patterned-traces on the substrate. Therefore, from the flow process of the fabrication according to the present invention, the requiring accuracy of the fabrication is gradually from high to less. Thus, the yield of the device is greatly improved. However, the conventional fabricating process is to form the patterned-traces and the patterns of the connecting pads on the substrate first, and then electrically connect the chip to the substrate. Because the requiring accuracy of the chip fabrication is much higher (the upper part of the semiconductor fabrication), and the requiring accuracy of the substrate fabrication is lower (the lower part of the semiconductor fabrication). Therefore, if the chip is connected to the substrate after the fabrication of the substrate, then the yield of the fabricating processes is not easily to control (the requiring accuracy in accordance with the connection of the chip to the substrate is much higher).

According to the foregoing embodiments of the present invention, the advantages of the present invention are described as follows:

1. The present invention provides a method of fabricating a multi-chips module that can carry out the fabrications of the chip and the substrate simultaneously.
2. The present invention provides a method of forming the patterned dielectric layer in order to expose the bonding pads of the chip and then utilizing the electroplating method to form the metal layer so that the bonding pads of the chip is electrically connected to the substrate. Thus, the connection between the chip and the substrate is reliable.
3. The present invention provides a method that can prevent the problem of producing the air bubble in the molding process or the underfilling process.
4. The present invention provides a fabricating method different from the conventional method such that from the flow of the fabricating processes of the present invention, the requiring accuracy of the fabrication is gradually from high to less. Thus, the yield of the device is greatly improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of a multi-chip module (MCM) package, comprising:

providing a substrate, the substrate having an insulating core and a conductive layer, wherein the conductive layer covers a bottom surface of the insulating core;

forming a first opening in the substrate to penetrate through the insulating core and the conductive layer;

adhering an adhesive tape to cover a surface of the conductive layer, wherein the first opening exposes a portion of a top surface of the adhesive tape;

adhering a first chip onto the exposed top surface of the adhesive tape, wherein the first chip has an active surface and a back surface, and a plurality of bonding pads are formed on the active surface of the first chip, the back surface of the first chip is adhered onto the adhesive tape such that the first chip is located firmly on the adhesive tape;

forming a patterned dielectric layer to fill into the first opening in order to cover a portion of the exposed top surface of the adhesive tape, the active surface of the first chip, the bonding pads of the chip and the insulating core, a plurality of second openings and third openings formed in the patterned dielectric layer, wherein the second openings expose the bonding pads of the first chip and the third openings penetrate through the patterned dielectric layer, the insulating core and the conductive layer;

electroplating a metal layer on sidewalls of the second openings and the third openings, and to cover the patterned dielectric layer;

after the electroplating process, removing the adhesive tape to expose the conductive layer, the back surface of the first chip and a portion of the patterned dielectric layer;

patterning the metal layer and the conductive layer to form a patterned metal and a patterned conductive layer are formed;

forming a patterned solder mask layer to cover surfaces of the patterned metal layer and the patterned conductive layer, wherein a plurality of fourth openings and fifth openings are formed on the patterned solder mask layer to expose respectively a portion of the patterned metal layer and a portion of the patterned conductive layer;

performing a solder ball process to form a plurality of solder balls on the fifth openings, wherein a reflow process is carried out to electrically connect the solder balls to the patterned conductive layer; and performing a die adhering process to electrically connect at least a second chip to the patterned metal layer via the fourth openings.

2. The method of claim 1, wherein the second chip further comprises a active surface and a plurality of conductive bumps are formed on the active surface of the second chip, a connection process between the second chip to the substrate, comprising:

performing a reflow process to electrically connect the conductive bumps to the exposed patterned metal layer via the fourth openings; and filling an underfilling material into gaps between the active surface of the second chip and the patterned solder mask layer.

3. The method of claim 1, wherein the second chip further comprises an active surface and a back surface, and a plurality of conductive bumps are formed on the active surface of the second chip, a connection process between the second chip to the substrate, comprising:

adhering the back surface of the second chip to the patterned solder mask layer;

performing a wire bonding process to electrically connect the bonding pads of the second chip to the exposed patterned metal layer via the fourth openings by utilizing a plurality of conductive wires; and performing molding process to encapsulate the second chip, the conductive wires, the fourth openings, a portion of patterned metal layer and a portion of patterned solder mask layer.

4. The method of claim 1, wherein a method of forming the first opening in the substrate includes a punching method.

5. The method of claim 1, wherein before patterning the metal layer and the conductive layer, a plug filling process is carried out to fill a plug material into the third openings.

6. The method of claim 1, wherein the method further comprises a planarizing process to planarize the surface of the metal layer before patterning the metal layer and the conductive layer.

7. The method of claim 6, wherein the planarizing process comprises a chemical mechanical polishing (CMP) process.

8. The method of claim 1, wherein the step of patterning the dielectric layer comprises:

forming a dielectric layer to fill the first opening and cover the insulating core layer, a portion of the adhesive tape, the active surface of the first chip and the bonding pads of the first chip;

forming second openings in the dielectric layer to expose the bonding pads; and forming the third openings in the dielectric layer to penetrate the dielectric layer, the insulating core and the conductive layer.

9. The method of claim 8, wherein a method of forming the second openings comprises a laser drilling method.

10. The method of claim 8, wherein a method of forming the second openings further comprises:

forming a patterned photoresist layer to cover the dielectric layer;

using the patterned photoresist layer as a mask to etch the dielectric layer in order to form the second openings such that the bonding pads are exposed.

11. The method of claim 8, wherein the method of forming the third openings comprises a machine drilling method.

12. The method of claim 8, wherein before forming the second openings, a planarizing process is carried out to planarize a surface of the dielectric layer.

13. The method of claim 12, wherein the planarizing process comprises a chemical mechanical polishing (CMP) method.

14. A method of a multi-chip module (MCM) package, comprising:

providing a substrate, the substrate having an insulating core and a conductive layer, wherein the conductive layer covers a bottom surface of the insulating core;

forming a first opening in the substrate to penetrate through the insulating core and expose a portion of the conductive layer;

adhering a first chip onto the exposed conductive layer, wherein the first chip has an active surface and a back surface, and a plurality of bonding pads are formed on the active surface of the first chip, the back surface of the first chip is adhered on the conductive layer such that the first chip is located firmly on the conductive layer;

forming a patterned dielectric layer to fill into the first opening in order to cover a portion of the exposed conductive layer, the active surface of the first chip, the bonding pads of the first chip and the insulating core, a plurality of second openings and third openings formed in the patterned dielectric layer, wherein the second openings expose the bonding pads of the first chip and the third openings penetrate through the patterned dielectric layer, the insulating core and the conductive layer;

electroplating a metal layer on sidewalls of the second openings and the third openings, and to cover the patterned dielectric layer;

patterning the metal layer and the conductive layer to form a patterned metal and a patterned conductive layer are formed;

forming a patterned solder mask layer to cover surfaces of the patterned metal layer and the patterned conductive layer, wherein a plurality of fourth openings and fifth openings are formed on the patterned solder mask layer to expose a portion of the patterned metal layer and a portion of the patterned conductive layer respectively;

performing a solder ball process to form a plurality of solder balls on the fifth openings, wherein a reflow process is carried out to electrically connect the solder balls to the patterned conductive layer; and performing a die adhering process to electrically connect at least a second chip to the patterned metal layer via the fourth openings.

15. The method of claim 14, wherein the second chip has an active surface, and a plurality of conductive bumps are formed on the active surface of the second chip, a connection process of the second chip to the substrate, comprising:

performing a reflow process to electrically connect the conductive bumps to the exposed patterned metal layer via the fourth openings; and filling an underfilling material into gaps between the active surface of the second chip and the patterned solder mask layer.

16. The method of claim 1, wherein the second chip further comprises an active surface and a back surface, and a plurality of conductive bumps are formed on the active surface of the second chip, a connection process of the second chip to the substrate, comprising:

adhering the back surface of the second chip to the patterned solder mask layer such that the second chip is located firmly on the patterned solder mask layer;

performing a wire bonding process to electrically connect the bonding pads of the second chip to the exposed patterned metal layer via the fourth openings by utilizing a plurality of conductive wires; and performing a molding process to encapsulate the second chip, the conductive wires, the fourth openings, a portion of patterned metal layer and a portion of patterned solder mask layer.

17. The method of claim 14, wherein a method of forming the first opening in the substrate includes a machine drilling method.

18. The method of claim 14, wherein before patterning the metal layer and the conductive layer, a plug filling process is carried out to fill the third openings with a plug material.

19. The method of claim 14, wherein the method further comprises a planarizing process to planarize the surface of the metal layer before patterning the metal layer and the conductive layer.

20. The method of claim 19, wherein the planarizing process comprises a chemical mechanical polishing (CMP) process.

21. The method of claim 14, wherein the step of patterning the dielectric layer further comprises:

forming a dielectric layer to fill the first opening and cover the insulating core layer, a portion of the conductive layer, the active surface of the first chip and the bonding pads of the first chip;

forming second openings in the dielectric layer to expose the bonding pads; and forming the third openings in the dielectric layer to penetrate the dielectric layer, the insulating core and the conductive layer.

22. The method of claim 21, wherein a method of forming the second openings comprises a laser drilling method.

23. The method of claim 21, wherein a method of forming the second openings further comprises:
- forming a patterned photoresist layer to cover the dielectric layer;
- using the patterned photoresist layer as a mask to etch through the dielectric layer such that the second openings are formed to expose the bonding pads.

24. The method of claim 21, wherein a method of forming the third openings comprises a machine drilling method.

25. The method of claim 21, wherein before forming the second openings, a planarizing process is carried out to planarize a surface of the dielectric layer.

26. The method of claim 25, wherein the planarizing process comprises a chemical mechanical polishing (CMP) method.

* * * * *